(12) United States Patent
Harvey et al.

(10) Patent No.: US 9,094,017 B2
(45) Date of Patent: Jul. 28, 2015

(54) CONTROL CIRCUITRY

(71) Applicant: Sequans Communications, Ltd., Reading (GB)

(72) Inventors: Jackson Harvey, Savage, MN (US); Peter Martin, Reading (GB)

(73) Assignee: Sequans Communications Ltd., Reading (GB)

( * ) Notice: Subject to any disclaimer, the term of this patent is extended or adjusted under 35 U.S.C. 154(b) by 0 days.

(21) Appl. No.: 13/686,110

(22) Filed: Nov. 27, 2012

(65) Prior Publication Data

US 2013/0136158 A1    May 30, 2013

Related U.S. Application Data

(60) Provisional application No. 61/565,232, filed on Nov. 30, 2011.

(51) Int. Cl.
*H03L 7/00* (2006.01)
*H03K 21/40* (2006.01)
*H03K 23/42* (2006.01)

(52) U.S. Cl.
CPC .............. *H03K 21/40* (2013.01); *H03K 23/425* (2013.01); *H03L 7/00* (2013.01)

(58) Field of Classification Search
CPC ............. H03L 7/00; H03L 7/081; H03L 7/16; H03L 7/18; H03L 7/1806; H03L 7/191; H03L 7/193; H03L 7/1974; H03L 7/1976; H03L 7/23
USPC .................. 375/316, 295, 354, 373, 362, 371
See application file for complete search history.

(56) References Cited

U.S. PATENT DOCUMENTS

| | | | | | |
|---|---|---|---|---|---|
| 4,870,659 | A | * | 9/1989 | Oishi et al. | 375/328 |
| 5,202,924 | A | * | 4/1993 | Richards, Jr. | 381/13 |
| 6,002,925 | A | * | 12/1999 | Vu et al. | 455/313 |
| 2002/0142718 | A1 | * | 10/2002 | Nawata | 455/12.1 |
| 2003/0048863 | A1 | * | 3/2003 | Saeki | 375/376 |
| 2006/0132229 | A1 | * | 6/2006 | Kawakubo et al. | 329/313 |
| 2007/0257714 | A1 | * | 11/2007 | Cheung | 327/117 |
| 2008/0056337 | A1 | * | 3/2008 | Tal et al. | 375/219 |
| 2011/0001522 | A1 | * | 1/2011 | Chan et al. | 327/118 |
| 2011/0291715 | A1 | * | 12/2011 | Sogawa et al. | 327/157 |

* cited by examiner

*Primary Examiner* — Siu Lee
(74) *Attorney, Agent, or Firm* — Hamilton, Brook, Smith & Reynolds, P.C.

(57) ABSTRACT

An arrangement is described in which phase parity or phase opposition between two signals can be determined, and if necessary remedial action may be taken.

12 Claims, 5 Drawing Sheets

CONTROL CIRCUITRY

RELATED APPLICATION

This application claims the benefit of U.S. Provisional Application No. 61/565,232, filed on Nov. 30, 2011. The entire teachings of the above application are incorporated herein by reference.

TECHNICAL FIELD

The present invention relates in general to the field of electronics. Without limitation, in some aspects it relates to frequency-division; in some others to the provision of quadrature signals.

BACKGROUND

In electronics, frequency dividers are used to convert a signal at a given frequency to a signal at an (usually even) integer sub-harmonic of that frequency. A specific example is that of divide-by-two circuitry. Each divider has an essentially random state variable that determines the phase of the outputs. Therefore, when two divide-by-two circuits are driven by the same input signal, the outputs of those circuits may be in-phase or anti-phase.

Referring to FIG. 1, an example of a divide-by-two circuit (10) is shown. It consists in this example of two D-type flip-flops (12, 14), both clocked at a common clock node (15). The second flip-flop (14) has an inverse clock input (16). The Qbar output of the second flip-flop 14 is connected to the D input of the first flip-flop 12, and the Q output of the first flip-flop (12) is connected to the D input of the second flip-flop (14). I and Q outputs are derived from the Q output of the first flip-flop (12) and of the second flip-flop (14) respectively. The I and Q outputs provide outputs 90 degrees phase apart, at half the clock rate. Other circuits for divide-by-two operation are known in the art.

Similarly, logic and other circuits for divide-by-n operation are well-known in the art.

Divide-by-two circuitry is used in many applications. A notable one concerns radio transceivers to generate quadrature local oscillator (LO) signals for use in mixers.

In such an application, the phase of the local oscillator signal input to a mixer is transferred to the mixer output; therefore, a randomly occurring 180 degree phase relationship between local oscillator signals leads to a randomly occurring 180 degree phase difference in the transfer function of the transmit or receive chains being driven by those local oscillator signals. Some transceiver operations, such as beamforming, require that the phase relationships between two transmit or receive paths stays constant over some period. If the dividers are reset or powered down during that period, it is possible for them to start up with the opposite phase relationship than they had previously. This randomly occurring 180 degree phase shift between the transmit or receive chains may be detrimental or even catastrophic to schemes that require knowledge of the phase relationship between those chains.

Additionally, there may be coupling of the divider outputs to the signal paths in the transceiver, leading to local oscillator radiation in the transmitter or DC offset in the receiver. If the phase relationship between the divider outputs is stable over time, calibration may be used to remove the effect of that coupling. However, if the phase relationship between the divider output changes from time to time, such calibration must be performed each time the dividers have an opportunity to change their phase relationship.

One solution would be to keep the dividers enabled over any period in which the phase relationship must stay constant. A shortcoming is that the circuits which generate and distribute the divider input signal, and the dividers themselves, may consume significant power. The inability to disable these blocks to save power during idle periods is a significant cost.

An alternative solution to this issue is to share a divider between the two mixers so as to guarantee a fixed phase relationship for all mixers each time the divider starts up. There are a number of potential issues with this solution. The first is that the quadrature local oscillator signal then needs to be routed from the shared divider to each of the mixers where it is used. This may necessitate long routes to one or more mixers. These long routes may require significant buffering to drive, which may consume a significant amount of power. The second issue is that long routing of quadrature signals may lead to quadrature mismatch. However, this issue is mitigated by any quadrature mismatch calibration that is performed. The third issue is that sharing a divider between several mixers is liable to increase coupling between the mixers, leading to unwanted signal coupling between transmit or receive paths. Separate dividers provide a level of isolation between paths.

SUMMARY

Some embodiments aim to address the problems set out above.

In one aspect there is provided an operating arrangement for a circuit, the circuit having plural circuit portions, the arrangement comprising a node for a frequency source coupled to plural frequency dividers, each frequency divider having an output connected to provide a respective divided frequency to a respective portion of the circuit, the arrangement comprising phase comparison circuitry connected to the outputs of the frequency dividers and correction circuitry responsive to an output of the phase comparison circuitry to act upon at least one frequency divider to cause the outputs of the frequency dividers to assume a desired phase relationship.

In an embodiment, each frequency divider is a divide-by-two circuit, there are two divide-by-two circuits and the correction circuitry is operable to cause the outputs of the divide-by-two circuits into phase parity.

In another embodiment, each frequency divider is a divide-by-two circuit, there are two divide-by-two circuits and the correction circuitry is operable to cause the outputs of the divide-by-two circuits into phase opposition.

In yet other embodiments, each frequency divider is a divide-by-two circuit, there are more than two divide-by-two circuits and the correction circuitry is operable to cause the outputs of the divide-by-two circuits into phase parity.

Arrangements where the desired phase relationship is other than all the same, for example one from N divide-by-two circuits different to the remaining (N−1) are envisaged.

In other embodiments, each frequency divider is a divide by M.

In some embodiments, each divide-by-two circuit provides first and second quadrature outputs and each circuit portion has first and second inputs for quadrature signals, the correction circuitry is operable to select between a first configuration in which the first and second outputs are connected to the first and second inputs and a second configuration in which the first and second outputs are connected to the second and first inputs respectively.

The phase comparison circuitry may be operable to compare one of the first and second quadrature outputs of each divide-by-two circuit.

The phase comparison circuitry may be operable to compare both of the first and second quadrature outputs of each divide-by-two circuit.

The phase comparison circuitry may be operable to compare the sums of the first and second quadrature outputs of each divide-by-two circuit.

In an embodiment there is a blocking circuit having an enable input for selectively permitting a signal at the output of the correction circuitry to act upon said at least one frequency divider.

In another aspect there is provided a radio transceiver comprising an operating arrangement for the transceiver, the transceiver having plural mixers, the arrangement comprising a node for a frequency source coupled to plural two divide-by-two circuits, each divide-by-two circuit operable to provide quadrature outputs to a respective mixer as quadrature local oscillator signals, the arrangement comprising phase comparison circuitry connected to the outputs of the divide-by-two circuits and correction circuitry responsive to an output of the phase comparison circuitry to act upon at least one divide-by-two circuit to cause the outputs of the divide-by-two circuits to assume a desired phase relationship.

BRIEF DESCRIPTION OF THE DRAWINGS

In the various figures, like reference signs refer to like parts.

DETAILED DESCRIPTION

Figure 1:
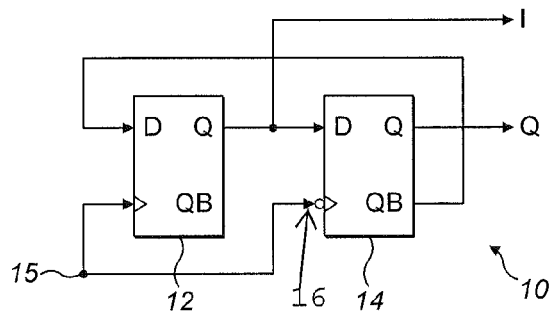
FIG. 1 shows block diagram of an example of a divide-by-two circuit.
Figure 2:
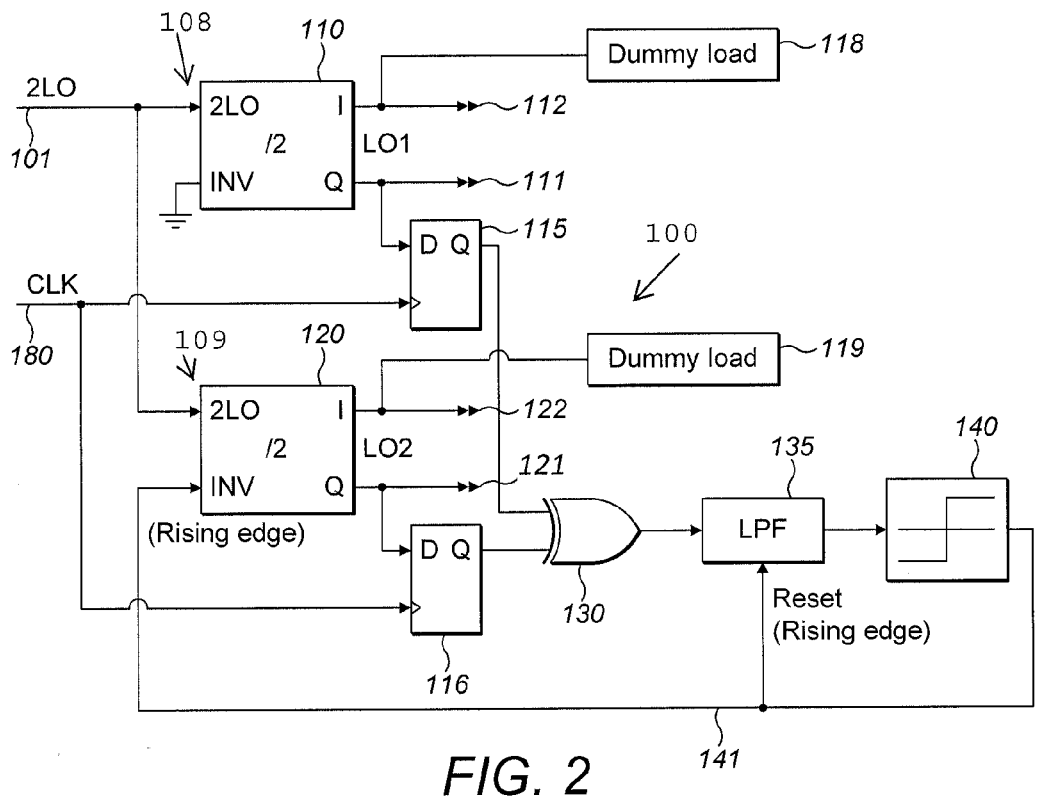
FIG. 2 shows a block diagram of a first example of a circuit for providing two quadrature local oscillator signals from an input frequency node, incorporating phase detection and correction.

Referring to FIG. 2, a first example of a circuit (100) for providing two quadrature local oscillator signals has a frequency reference node (101) providing clock pulses to the clock nodes (108,109) of two divide-by-two circuits (110, 120). Each of the divide-by-two circuits (110,120) provides a respective pair of quadrature outputs (111,112; 121,122). Of these, a respective one (111, 121) is considered "in-phase" and the respective other (112, 122) is considered to be the quadrature output, at 90 degrees phase to the "in-phase" output. These signals are used to supply quadrature signals in demodulation (to mixers, not shown).

A low frequency sample clock input (180) is connected to the clock nodes of two D-type flip-flops (115, 116), whose D inputs are connected to receive the divided frequency inphase outputs (111,121) from the respective divide-by-two circuits (110,120). Typically "low frequency" means of the order of 1/80 to 1/240 the frequency applied to the frequency reference node (101). In a consumer electronics transceiver environment, the frequency of the frequency reference node may of the order of 800 MHz to 12 GHz.

The Q outputs of the two D-type flip-flops are connected as inputs to an XOR gate (130). As is known to those skilled in the art, XOR functionality means that the gate (130) provides a logical one output only when the two inputs are contrary, i.e. 1,0 or 0,1. Dummy loads (118, 119) are connected to the quadrature outputs (112,122) of the divide-by-two circuits (10, 120) to compensate for the loading of the D flip-flops (115,116), typically for their capacitance.

The output of the XOR gate (130) is passed to a low pass filter (135) whose output is fed to a thresholding circuit (140). The output (141) of the thresholding circuit (140), forming an "invert" signal is shown as being fed back to an invert input of one (120) of the divide-by-two circuits (110,120). It could of course go instead to the invert input of the other (110) divide-by-two circuit.

Initially the frequency reference node (101) is maintained at a quiescent level while the mixers are not required. When the node (101) is supplied with the double local oscillator signal, the divide-by-two circuits (110,120) may start in phase parity or phase opposition.

Assuming the phase parity state: the in-phase outputs (111, 121) will be mutually in-phase.

While the inputs to the XOR gate are the same, the gate produces a logic zero; while the inputs differ the gate produces a logic one. The output of the gate goes to the low pass filter (135) which operates to prevent rapid or erroneous switching between states. The filter output is compared by the thresholding device (140) against a threshold. The value of the threshold is determined so that if the outputs of the two divide-by-two circuits (110,120) are in phase parity, the threshold is not reached regardless of the existence of any short periods where one sampled output is different to the other. Thus the output of the thresholding circuit (140) remains at logic zero.

Then, assuming the phase opposition state, the in-phase outputs (111,121) will be mutually out of phase. The XOR gate (130) provides a logic one which is passed by the low pass filter (135) whose output reaches the threshold of the thresholding circuit (140). The output of the thresholding circuit (140) switches to logic one, the rising edge of the transition resets the low pass filter and acts on one of the divide-by-two circuits (120) to invert its outputs so that its so-called "in phase output" assumes the opposite state to the previous state whereby both in-phase outputs of the two divide-by-two circuits come into phase parity.

Figure 3:
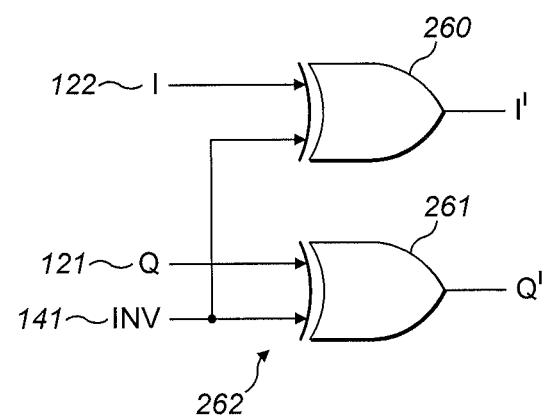
FIG. 3 shows a schematic diagram of one example of an output inverter circuit for a divide-by-two.

Referring to FIG. 3, a schematic diagram of circuitry (262) for inverting the output of the divide-by-two (120) consists of a first and a second two-input XOR gate (260, 261). As is well-known, the XOR function dictates that the output of the gate will be at logic 1 if, and only if, one of the inputs is at logic 1.

The first gate (260) receives the I output of the divide-by-two (120) at one of its inputs, and the second gate (261) receives the Q output of the divide-by-two (120) at one of its inputs. The second input of each gate (260,261) receives the invert signal (141).

In operation, assume the invert signal is low (logic 0). Then, in one state, the I input to first gate (260) is logic 1, and the output (by virtue of the XOR function) will be logic 1. In the other state the I input will be logic 0 and the output is thus logic 0.

The second gate operates in the same way, and hence the circuitry (262) for inverting has no effect while the "invert" input is low.

Assume now that the invert signal is high. Then in the one state (I=1), the first gate (260) has a logic 0 output; in the other (I=0) it has a logic 1 output. The second gate operates in the same way. Hence the circuitry (262) for inverting causes the outputs to be the inverse of the inputs while the "invert" input is high.

Many other circuits for output inversion may be provided, as is clear to one of skill.

The filter (135) and threshold (140) operation may be achieved using an accumulator with overflow detection (with the overflow indicator forming the output signal). A "leaky" accumulator may also be used to ignore infrequently occurring errors.

It is possible that the clock to the high-speed samplers could be inadvertently skewed. However, this does not lead to an error, since the skew would be stable with time. That is, difference between the sampling instants between the two samplers would be the same between subsequent enable periods of the dividers, and would therefore not cause a change in the phase relationship between the divider outputs over time. Note that this might cause the divider outputs to be anti-phase rather than in-phase, but this phase relationship would be stable with time and therefore is unimportant. Clock jitter in the sampling clock, as long as it is shared between both samplers, also does not lead to an error. Clock jitter that effects only one sampler leads to erroneous instantaneous comparisons, but these are filtered using the low pass filter (135) and therefore do not lead to an error in the final phase relationship between the LO signals.

Figure 4:
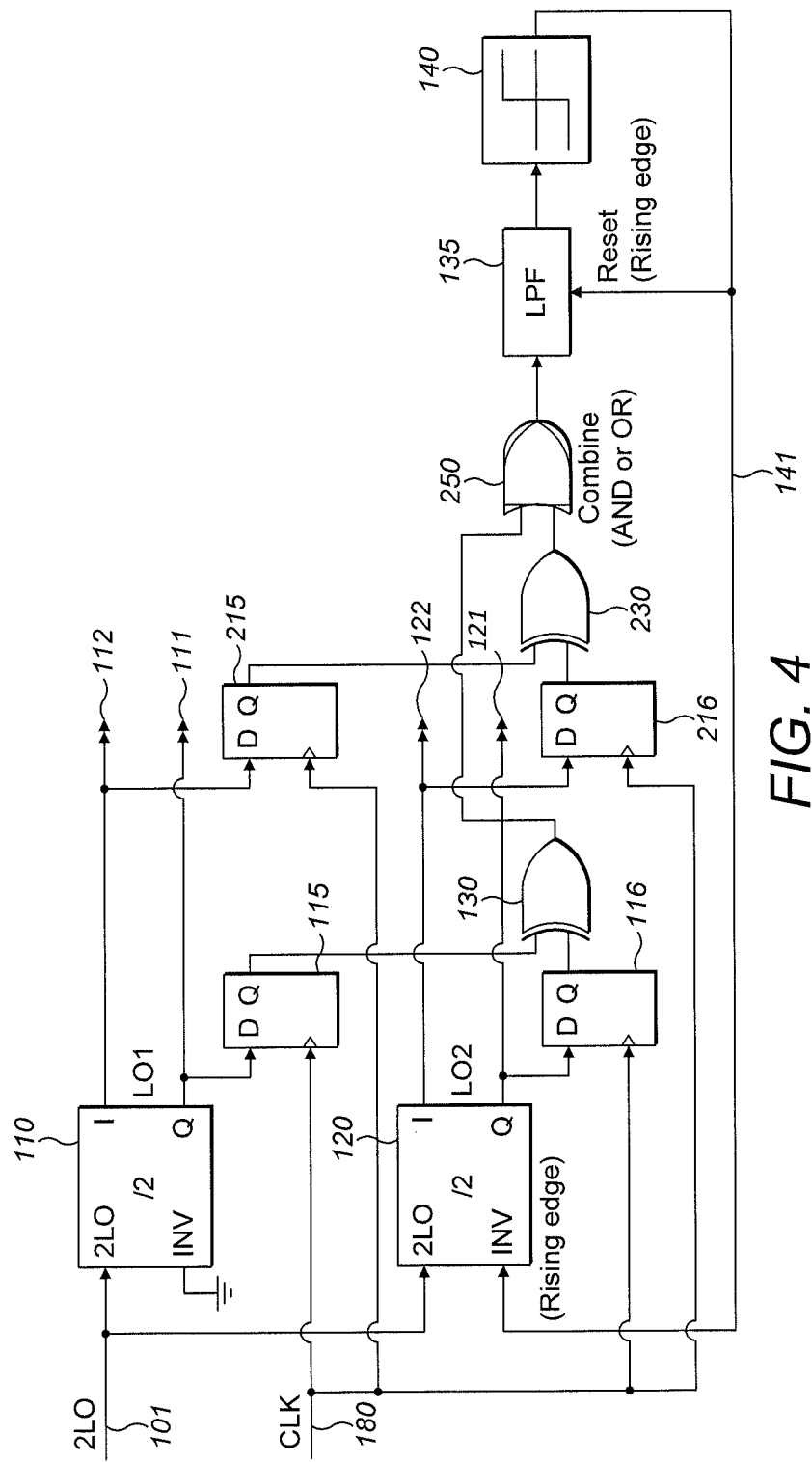
FIG. 4 shows a block diagram of a first example of a circuit for providing two quadrature local oscillator signals from an input frequency node, incorporating phase detection and correction in which both quadrature signals are sensed.

Referring to FIG. 4, an example is shown in which both outputs of the divide-by-twos are compared with one another. This circuit is similar to that of FIG. 2, but with a duplicate set of D-type flip-flops (215, 216), a second XOR gate (230) and a further gate (250) combining the outputs of the two XOR gates (130,230) in either AND or OR fashion.

It is assumed that the output of the comparison may occasionally be in error, due to noise or power supply noise or other factors. The purpose of the second set of flip-flops (215, 216) with the gates (230, 250), acting as samplers and comparator is to make use of the additional information that is available to help average-out the effects of any such errors. An additional benefit is that the loads on each of I and Q are better balanced, since identical circuits are attached to each. With gate 250 as an AND gate it can be ensured that both samplers agree before making a decision to change phase.

Figure 5:
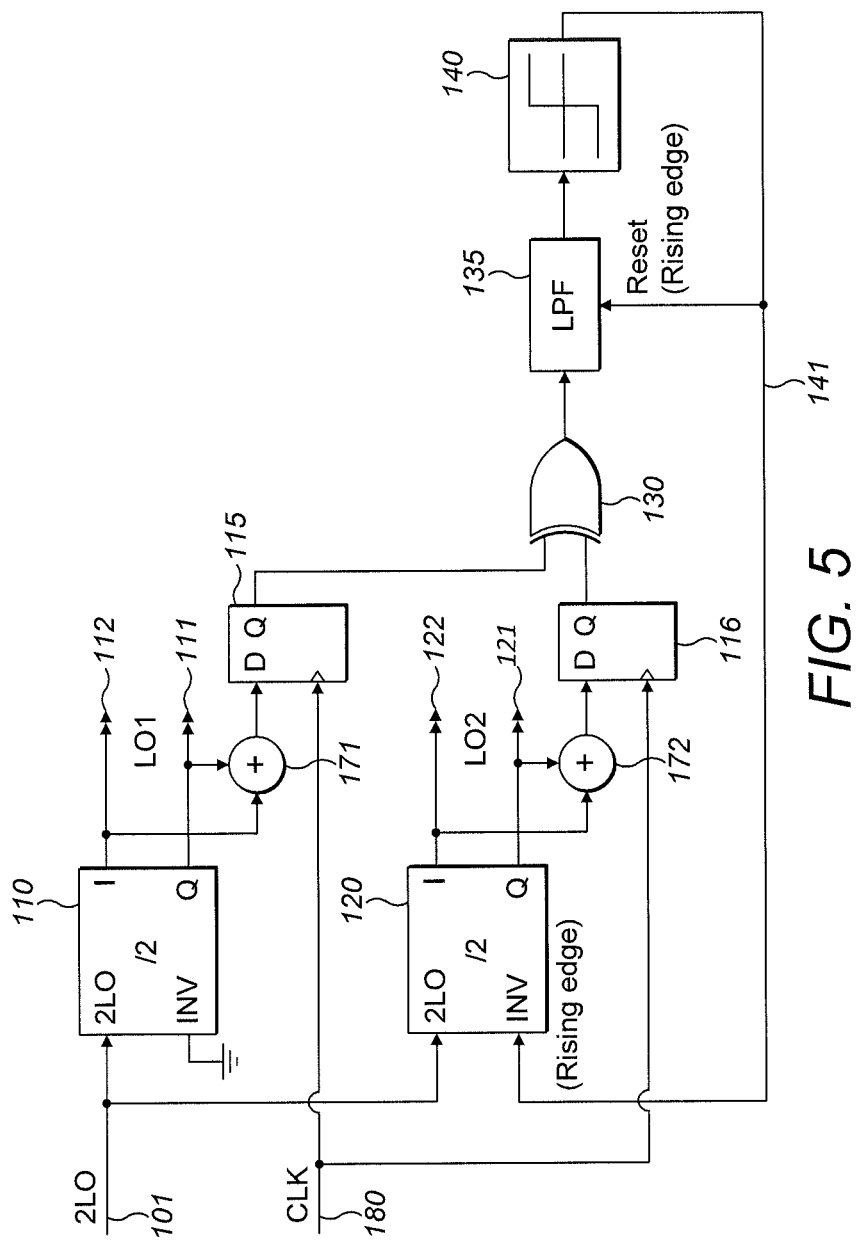
FIG. 5 shows a block diagram of a first example of a circuit for providing two quadrature local oscillator signals from an input frequency node, incorporating phase detection and correction, in which the quadrature outputs are summed for use in comparison.

Referring now to FIG. 5, a further modification allowing both outputs of both divide-by-twos (110,120) is shown. In this case the I and Q outputs (111,112; 121, 122) of each divide-by-two (110,120) are summed in respective adders (171, 172). It is the output of the adders (171,172) that provides the inputs to the d-type flip-flops (115,116).

In this case, the loading on I and Q are identical, since they are each loaded by identical ports of the shared adder. None of the information used for comparison is lost by the addition, and depending on the implementation of the dividers and of the adder, the adder can be used to condition the signal for more robust comparison.

Figure 6:
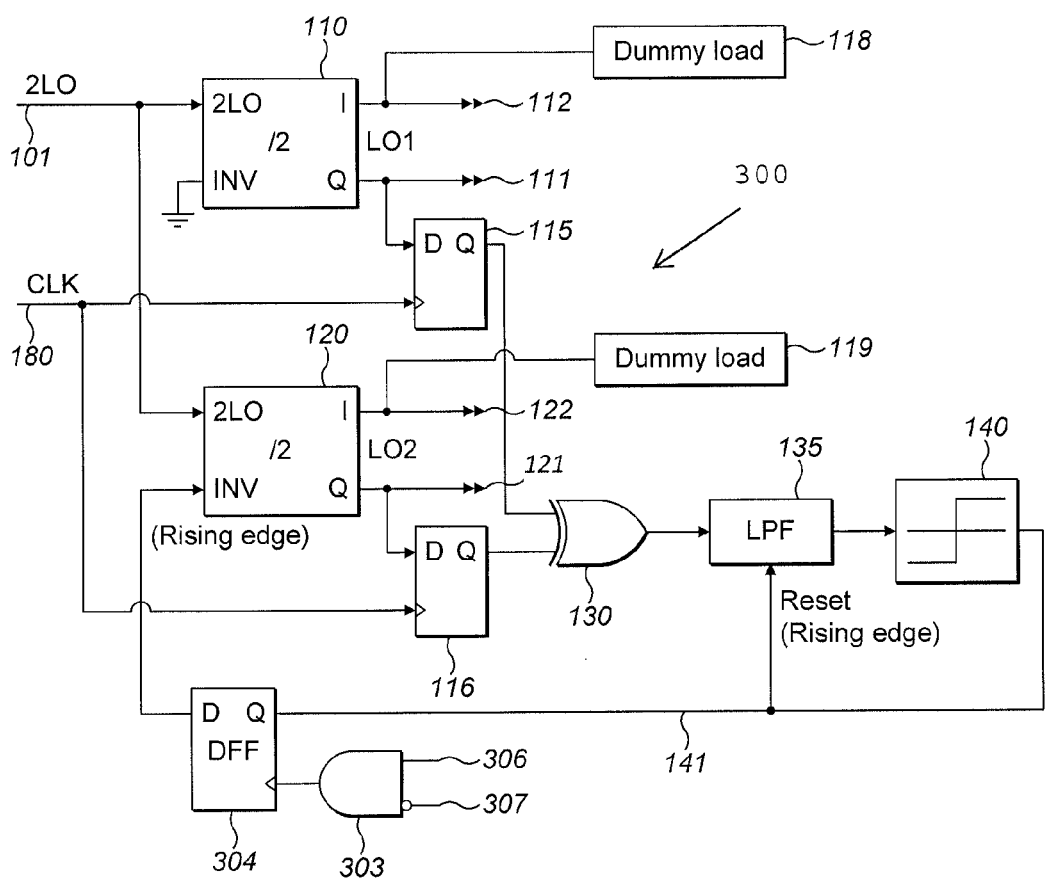
FIG. 6 shows a modified version of FIG. 5 having additional circuitry for controlling the application of a correction signal.

Referring to FIG. 6, an example of a control or inhibit circuit (300) is shown incorporated into the example of FIG. 2. It will be understood that this circuit could be incorporated into any of the described examples, and that different arrangements having similar functionality will be apparent to the person of skill.

The circuit (300) allows an inhibit signal (307) to freeze the state of the "INVERT" signal (141) so that no change in phase relationship is possible while the inhibit signal is enabled. In the case of a transceiver it may be enabled during transmission or reception. This is an improvement if a change in phase relationship between LO signals is detrimental but not catastrophic, but a step change in LO phase during transmission or reception is catastrophic. Such an inhibit signal prevents the LO phases from changing to achieve the desired phase relationship, at the cost of a catastrophic step change in LO phase during transmission or reception.

The circuit (300) has a further D-type flip flop (304) with its D input receiving the invert signal (141). Its Q output connects to the invert input of the second flip-flop (120). Its clock input is controlled by the output of a two input gate (303). The first input (306) of the gate (303) receives the low frequency sample clock signal (180); the second input (307) receives the inverse of the inhibit signal (gate shown as having an inverting input).

In use when the inhibit signal (307) logic 0, the gate (303) passes the clock to the further D-type flip flop (304), which clocks the value of the INVERT signal (141) from D input to Q output.

When the inhibit signal (307) is taken to logic 1, the further D-type flip flop (304) is no longer clocked so it holds the last value of INVERT that was clocked to output Q. In this way it freezes the phase relationship of the first and second flip-flops (110,120) and hence the phase relationship of their output signals Although the described examples refer to a situation in which phase parity is desirable, it is also applicable to situations where phase opposition is desired. It is also applicable to situations where more than two dividers are provided and where the dividers are divide by n (n>2).

The examples allow the dividers, and possibly the blocks which generate the input signal to the dividers, to be powered down without a change in the phase relationship of the outputs of the dividers when those blocks are re-enabled. It achieves this without requiring a shared divider, thereby avoiding the disadvantages of a shared divider as described above. Additionally, the cost of the apparatus is presumed to be low. It requires a means of inverting the output of one divider, as well as a high-speed sampler for each LO. The additional blocks are all low-speed and low-cost.

Description has been made with reference to several examples. The scope is not restricted to described features but extends instead to the full scope of the appended claims and their equivalents.

While this invention has been particularly shown and described with references to example embodiments thereof, it will be understood by those skilled in the art that various changes in form and details may be made therein without departing from the scope of the invention encompassed by the appended claims.

What is claimed is:

1. An operating arrangement for a circuit, the circuit having plural circuit portions, the arrangement comprising a node for a frequency source coupled to plural frequency dividers, each frequency divider having an output connected to provide a respective divided frequency to a respective portion of the circuit, the arrangement comprising phase comparison circuitry connected to the outputs of the frequency dividers and correction circuitry responsive to an output of the phase comparison circuitry to act upon at least one frequency divider to cause the outputs of the frequency dividers to assume a desired phase relationship, wherein each frequency divider is a divide-by-two circuit, there are two divide-by-two circuits and the correction circuitry is operable to cause the outputs of the divide-by-two circuits into phase parity, wherein each divide-by-two circuit provides first and second quadrature outputs and each circuit portion has first and second inputs for quadrature signals, the correction circuitry is operable to select between a first configuration in which the first and second quadrature outputs are connected to the first and second inputs and a second configuration in which the first and second quadrature outputs are connected to the second and first inputs respectively.

2. The arrangement of claim 1, wherein the phase comparison circuitry is operable to compare one of the first and second quadrature outputs of each divide-by-two circuit.

3. The arrangement of claim 1, wherein the phase comparison circuitry is operable to compare both of the first and second quadrature outputs of each divide-by-two circuit.

4. The arrangement of claim 1, wherein the phase comparison circuitry is operable to compare the sums of the first and second quadrature outputs of each divide-by-two circuit.

5. An operating arrangement for a circuit, the circuit having plural circuit portions, the arrangement comprising a node for a frequency source coupled to plural frequency dividers, each frequency divider having an output connected to provide a respective divided frequency to a respective portion of the circuit, the arrangement comprising phase comparison circuitry connected to the outputs of the frequency dividers and correction circuitry responsive to an output of the phase comparison circuitry to act upon at least one frequency divider to cause the outputs of the frequency dividers to assume a desired phase relationship, wherein each frequency divider is a divide-by-two circuit, there are two divide-by-two circuits and the correction circuitry is operable to cause the outputs of the divide-by-two circuits into phase opposition, wherein each divide-by-two circuit provides first and second quadrature outputs and each circuit portion has first and second inputs for quadrature signals, the correction circuitry is operable to select between a first configuration in which the first and second outputs are connected to the first and second inputs and a second configuration in which the first and second outputs are connected to the second and first inputs respectively.

6. The arrangement of claim 5, wherein the phase comparison circuitry is operable to compare one of the first and second quadrature outputs of each divide-by-two circuit.

7. The arrangement of claim 5, wherein the phase comparison circuitry is operable to compare both of the first and second quadrature outputs of each divide-by-two circuit.

8. The arrangement of claim 5, wherein the phase comparison circuitry is operable to compare the sums of the first and second quadrature outputs of each divide-by-two circuit.

9. An operating arrangement for a circuit, the circuit having plural circuit portions, the arrangement comprising a node for a frequency source coupled to plural frequency dividers, each frequency divider having an output connected to provide a respective divided frequency to a respective portion of the circuit, the arrangement comprising phase comparison circuitry connected to the outputs of the frequency dividers and correction circuitry responsive to an output of the phase comparison circuitry to act upon at least one frequency divider to cause the outputs of the frequency dividers to assume a desired phase relationship, further having an input for a sampling signal, the input for the sampling signal being connected to a control node of the phase comparison circuitry.

10. An operating arrangement according to claim 9, further having an inhibit circuit having an enable input for inhibiting a signal at the output of the correction circuitry from acting upon said at least one frequency divider.

11. A radio transceiver comprising an operating arrangement for the transceiver, the transceiver having plural mixers, the operating arrangement comprising a node for a frequency source coupled to plural two divide-by-two circuits, each divide-by-two circuit operable to provide quadrature outputs to a respective mixer as quadrature local oscillator signals, the operating arrangement comprising phase comparison circuitry connected to the outputs of the divide-by-two circuits and correction circuitry responsive to an output of the phase comparison circuitry to act upon at least one divide-by-two circuit to cause the outputs of the divide-by-two circuits to assume a desired phase relationship.

12. An operating arrangement for a circuit, the circuit having plural circuit portions, the arrangement comprising a node for a frequency source coupled to plural frequency dividers, each frequency divider having an output connected to provide a respective divided frequency to a respective portion of the circuit, the arrangement comprising phase comparison circuitry connected to the outputs of the frequency dividers and correction circuitry responsive to an output of the phase comparison circuitry to act upon at least one frequency divider to cause the outputs of the frequency dividers to assume a desired phase relationship, wherein each frequency divider is a divide-by-two circuit, there are two divide-by-two circuits and the correction circuitry is operable to cause the outputs of the divide-by-two circuits into phase opposition, further having an inhibit circuit having an enable input for inhibiting a signal at the output of the correction circuitry from acting upon said at least one frequency divider.

* * * * *